US011488853B2

(12) United States Patent
Kakinuma

(10) Patent No.: US 11,488,853 B2
(45) Date of Patent: Nov. 1, 2022

(54) APPARATUS FOR AFFIXING SHEET

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/648,832

(22) Filed: Jan. 25, 2022

(65) Prior Publication Data

US 2022/0254674 A1  Aug. 11, 2022

(30) Foreign Application Priority Data

Feb. 9, 2021  (JP) .............................. JP2021-019393

(51) Int. Cl.
  *B29C 65/00* (2006.01)
  *H01L 21/683* (2006.01)
  *B29C 65/48* (2006.01)
(52) U.S. Cl.
  CPC .......... *H01L 21/6835* (2013.01); *B29C 65/48* (2013.01)
(58) Field of Classification Search
  CPC ........................... B29C 65/48; H01L 21/6835
  See application file for complete search history.

(56) References Cited

U.S. PATENT DOCUMENTS

| 5,810,537 | A  | * | 9/1998 | Briner ............... H01L 21/67775 414/940 |
| 6,053,688 | A  | * | 4/2000 | Cheng ............... H01L 21/67772 414/217 |
| 6,318,945 | B1 | * | 11/2001 | Hofmeister ....... H01L 21/67751 414/217 |
| 7,607,879 | B2 | * | 10/2009 | Hall .................. H01L 21/67196 414/217 |
| 10,134,619 | B2 | * | 11/2018 | Kondoh ............ H01L 21/67376 |
| 11,199,528 | B2 | * | 12/2021 | Kotsugai ........... H01L 21/67393 |
| 2014/0305540 | A1 | * | 10/2014 | Oyama ............. H01L 21/67769 141/4 |
| 2015/0214084 | A1 | * | 7/2015 | Schneider ......... H01L 21/67379 206/719 |
| 2017/0178942 | A1 | * | 6/2017 | Sakata ............. H01L 21/67775 |
| 2022/0020614 | A1 | * | 1/2022 | Masuda ............. H01L 21/6836 |

FOREIGN PATENT DOCUMENTS

JP          2016009786 A    1/2016

* cited by examiner

*Primary Examiner* — Philip C Tucker
*Assistant Examiner* — Nickolas R Harm
(74) *Attorney, Agent, or Firm* — Greer Burns & Crain Ltd.

(57) ABSTRACT

A sheet affixing apparatus has a frame stocker for housing a plurality of annular frames stacked therein. The frame stocker includes a support stage for supporting the stack of annular frames placed thereon, a plurality of abutting members for positioning the annular frames in a predetermined position on the support stage, the abutting members being erected around the support stage, an openable and closable door for separating an area that houses the support stage and the abutting members therein, the openable and closable door being disposed laterally of the support stage, a sensor for detecting when the openable and closable door is closed, an entry member movable into and out of the recesses of the annular frames placed on the support stage, in ganged relation to opening and closing movement of the openable and closable door, and a control unit.

2 Claims, 8 Drawing Sheets

APPARATUS FOR AFFIXING SHEET

BACKGROUND OF THE INVENTION

Field of the Invention

The present invention relates to an apparatus for affixing a sheet.

Description of the Related Art

For dividing, grinding, and processing various plate-shaped workpieces such as wafers, glass substrates, or ceramic substrates with semiconductor devices formed thereon, there has widely been used in the art a technology in which a workpiece is securely placed in the opening of an annular frame by a sheet such as an adhesive tape, thereby providing a frame unit made up of the workpiece, the annular frame, and the sheet, in order to facilitate delivery operation and prevent chips from being fragmented. A sheet affixing apparatus has also widely been used in the art for securing a workpiece to an annular frame with an adhesive tape (see, for example, Japanese patent No. 6302765). The sheet affixing apparatus generally includes a frame stocker for stocking annular frames that are secured in a stacked fashion in a predetermined position by a plurality of pins extending through openings in the annular frames.

SUMMARY OF THE INVENTION

However, since the annular frames are stocked by the pins extending therethrough in the frame stocker, the annular frames can be loaded into and unloaded from the frame stocker only in the directions along the pins. When a number of annular frames are to be placed all together into the frame stocker, therefore, an operator needs to do hard work to take the annular frames all the way up to a position above the pins.

Each of the annular frames has a notch defined as a recess therein that is oriented in a predetermined direction to indicate the orientation of the annular frame. The notch is used to assist in orienting a workpiece that is secured to the annular frame in the orientation of the annular frame, so that the workpiece can easily be directed on the basis of the notch in the annular frame while the workpiece is being processed. For stocking annular frames in the sheet affixing apparatus, it is necessary to stock the annular frames in a predetermined orientation and affix sheets to the annular frames directed in a desired orientation.

It is therefore an object of the present invention to provide a sheet affixing apparatus that is capable of affixing a sheet to an annular frame directed in a desired orientation.

In accordance with an aspect of the present invention, there is provided a sheet affixing apparatus for affixing a sheet to an annular frame having a recess defined therein at a predetermined position on an outer circumferential edge thereof in closing relation to an opening defined in the annular frame, with a workpiece being securely placed in the opening by the sheet. The sheet affixing apparatus includes a frame stocker for housing a plurality of annular frames stacked therein, a frame unloading unit for unloading one at a time of the annular frames from the frame stocker, and a sheet affixing unit for affixing the sheet to the annular frame and the workpiece. The frame stocker includes a support stage for supporting the stack of annular frames placed thereon, a plurality of abutting members for abutting against side surfaces of the annular frames to position the annular frames in a predetermined position on the support stage, the abutting members being erected around the support stage, an openable and closable door for separating an area that houses the support stage and the abutting members therein, the openable and closable door being disposed laterally of the support stage, a sensor for detecting when the openable and closable door is closed, an entry member movable into and out of the recesses of the annular frames placed on the support stage, in ganged relation to opening and closing movement of the openable and closable door, and a control unit. The entry member is installed to allow the openable and closable door to be closed when the entry member enters the recesses of the annular frames that are placed on the support stage in a predetermined orientation. When the sensor detects when the openable and closable door is closed, the control unit determines that the annular frames are placed on the support stage in the predetermined orientation, and allows the frame unloading unit to unload one at a time of the annular frames from the frame stocker.

Preferably, the frame stocker further includes a lifting and lowering unit, the support stage being fixedly mounted on the lifting and lowering unit. Preferably, the lifting and lowering unit lifts the support stage such that an uppermost one of the annular frames stacked on the support stage is positioned at a predetermined height, and the frame unloading unit unloads the uppermost one of the annular frames from the frame stocker while the entry member is staying in the recesses of the annular frames stacked on the support stage.

According to the present invention, the sheet affixing apparatus is capable of affixing a sheet to an annular frame that is directed in a desired orientation.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will be described in detail hereinbelow with reference to the accompanying drawings. The present invention is not limited to the details of the embodiment described below. The components described below cover those which could easily be anticipated by those skilled in the art and those which are essentially identical to those described above. Further, the arrangements described below can be combined in appropriate manners. Various omissions, replacements, or changes of the arrangements may be made without departing from the scope of the present invention.

Figure 1:
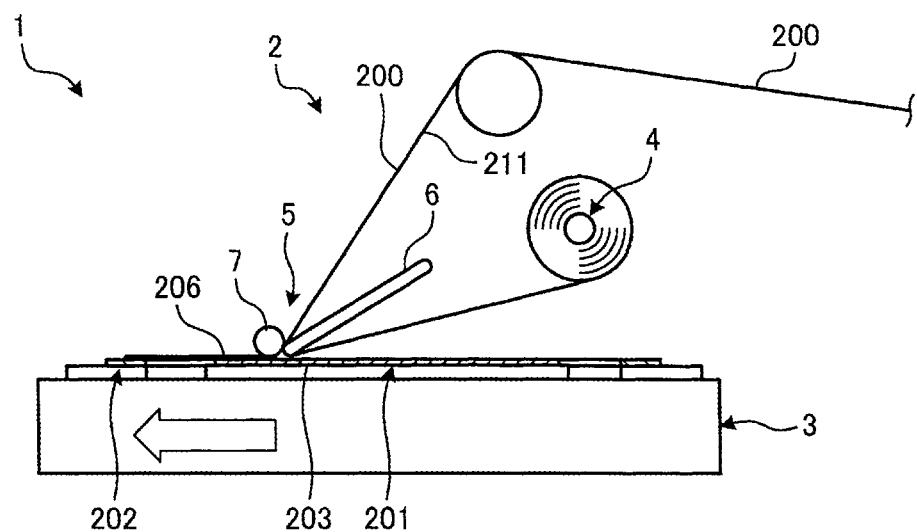
FIG. 1 is a schematic side elevational view, partly in cross section, of a structural example of a sheet affixing apparatus according to an embodiment of the present invention.
Figure 1:
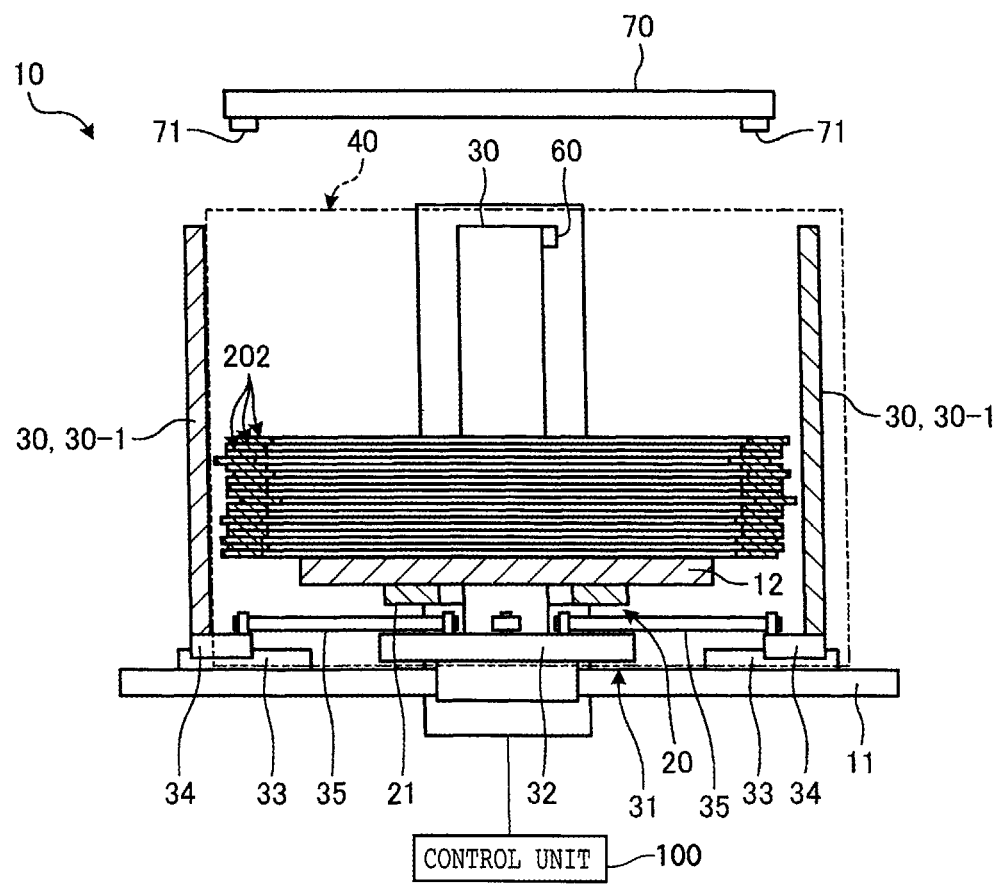
Figure 2:
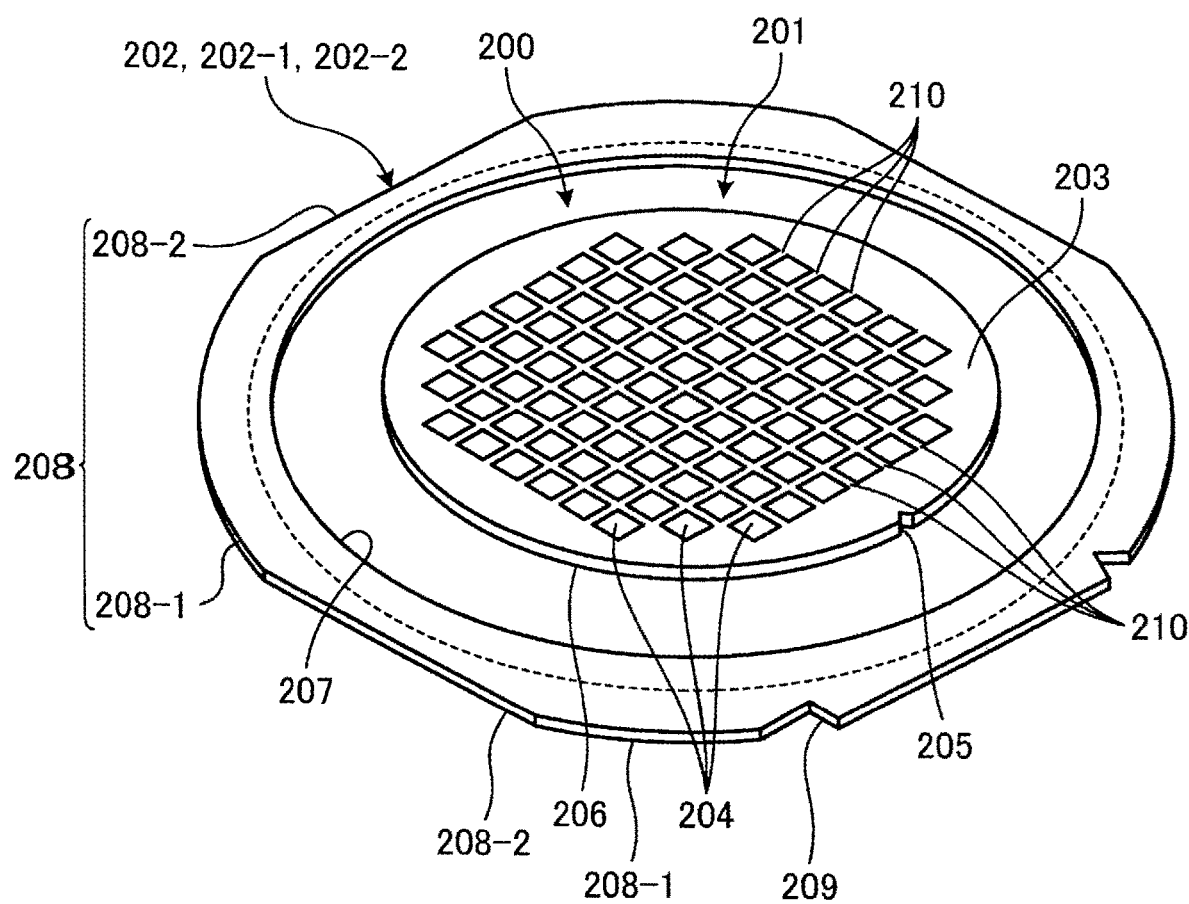
FIG. 2 is a perspective view illustrating by way of example a workpiece to which a sheet has been affixed by the sheet affixing apparatus illustrated in FIG. 1.
Figure 3:
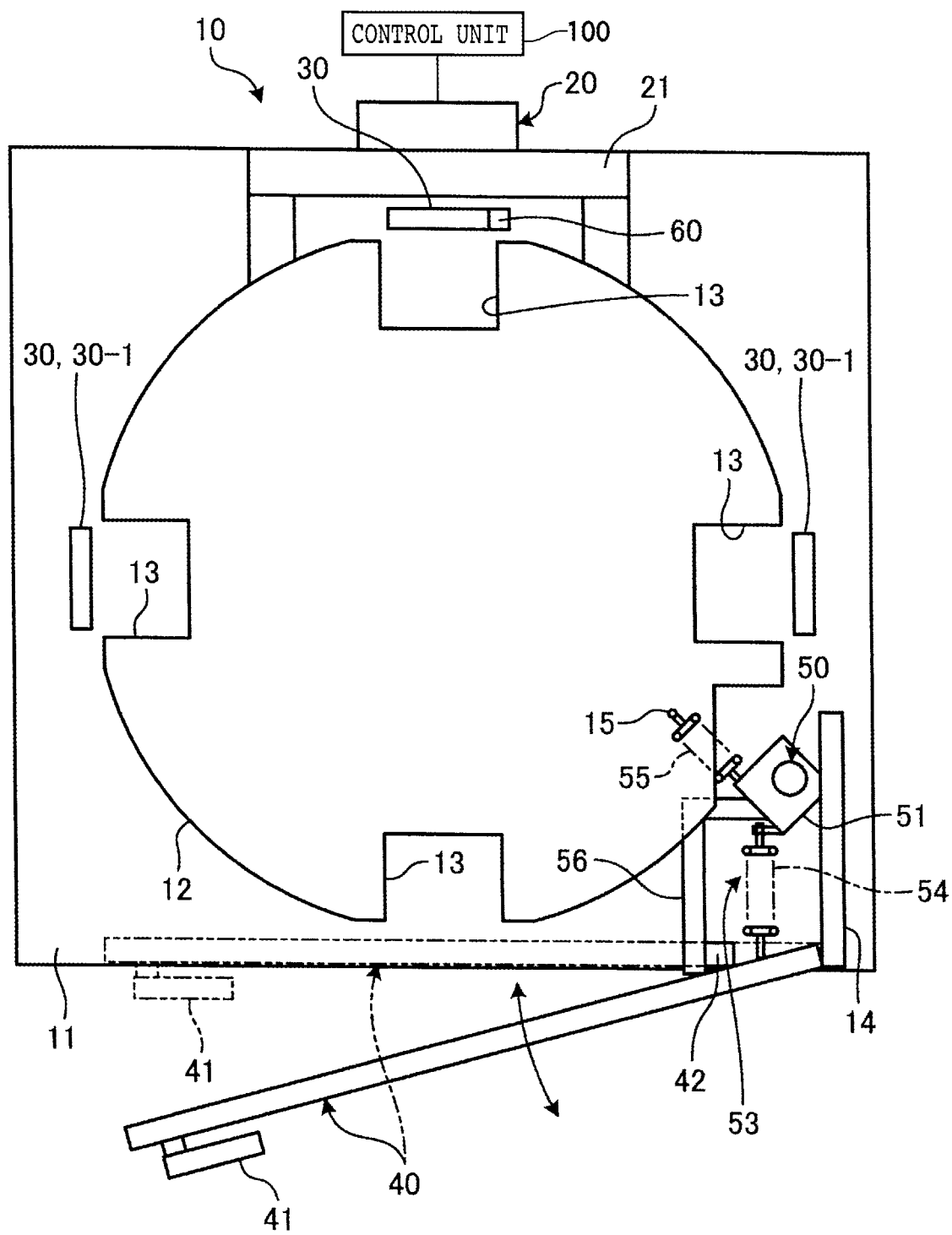
FIG. 3 is a schematic plan view of a frame stocker of the sheet affixing apparatus illustrated in FIG. 1.
Figure 4:
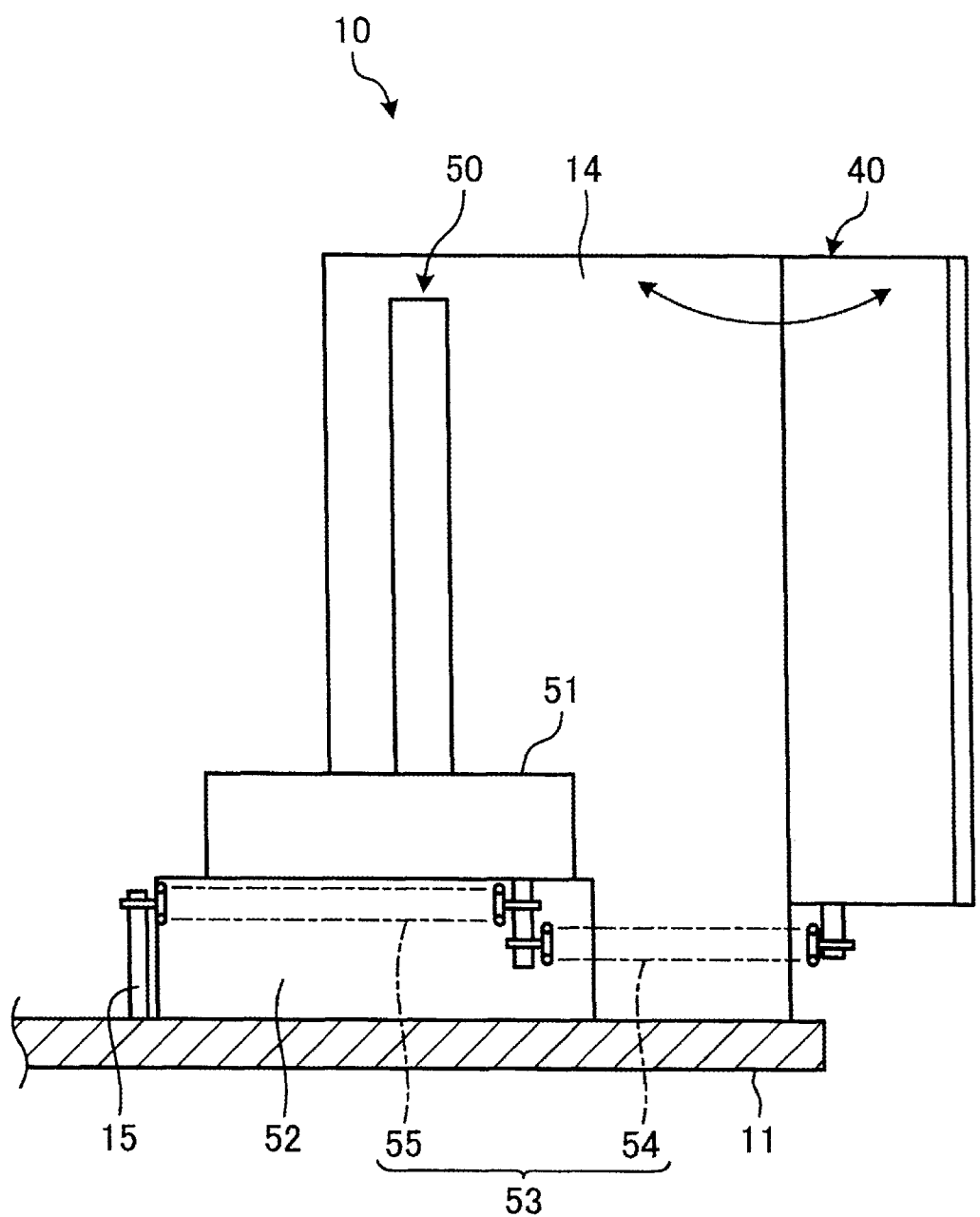
FIG. 4 is a side elevational view, partly in cross section, of the frame stocker illustrated in FIG. 3.

A sheet affixing apparatus according to the preferred embodiment of the present invention will be described below with reference to the drawings. FIG. 1 schematically illustrates in side elevation, partly in cross section, a structural example of the sheet affixing apparatus according to the present embodiment. FIG. 2 illustrates in perspective by way of example a workpiece to which a sheet has been affixed by the sheet affixing apparatus illustrated in FIG. 1. FIG. 3 schematically illustrates in plan a frame stocker of the sheet affixing apparatus illustrated in FIG. 1. FIG. 4 illustrates in side elevation, partly in cross section, the frame stocker illustrated in FIG. 3.

The sheet affixing apparatus, denoted by 1 in FIG. 1, according to the present embodiment is an apparatus for affixing a sheet 200 to a workpiece 201 and an annular frame 202 illustrated in FIG. 2. The workpiece 201 to which the sheet 200 is affixed by the sheet affixing apparatus 1 includes a semiconductor wafer, an optical device wafer, or the like that is shaped as a circular plate, including a substrate made of silicon (Si), sapphire ($Al_2O_3$), gallium arsenide (GaAs), silicon carbide (SiC), or the like.

As illustrated in FIG. 2, the workpiece 201 has a plurality of devices 204 each formed in each of areas demarcated on a face side 203 thereof by a grid of intersecting projected dicing lines 210. The devices 204 are, for example, integrated circuits (ICs), large-scale-integration (LSI) circuits, image sensors such as charge-coupled devices (CCDs), or complementary-metal-oxide semiconductors (CMOSs), micro-electro-mechanism systems (MEMS), or the like. According to the present invention, the workpiece 201 is not limited to a wafer, but may be a rectangular resin-packaged substrate having a plurality of resin-encapsulated devices, a ceramic plate, a glass plate, or the like.

The workpiece 201 includes an irregularly shaped portion 205 representing the crystal orientation of the substrate. According to the present embodiment, the irregularly shaped portion 205 illustrated as a notch defined in an outer edge of the substrate.

According to the present embodiment, a circular sheet 200 is affixed to a reverse side 206 of the workpiece 201 that is opposite to the face side 203, and an annular frame 202 is affixed to an outer edge portion of the sheet 200. The sheet 200 is in the form of a flexible resin sheet. The sheet 200 that has temporarily been bonded to a web-shaped peel-off sheet 211 (see FIG. 1) is supplied to the sheet affixing apparatus 1, where the sheet 200 is peeled off from the peel-off sheet 211 and affixed to the reverse side 206 of the workpiece 201 and the annular frame 202. When the circular sheet 200 temporarily bonded to the peel-off sheet 211 is supplied to the sheet affixing apparatus 1, the peel-off sheet 211 is folded back by a presser plate 6, depicted in FIG. 1, of a sheet affixing unit 2, leaving the sheet 200 peeled off from the peel-off sheet 211, and the sheet 200 is then affixed to the workpiece 201 and the annular frame 202 by a presser roller 7.

According to the present embodiment, the sheet 200 includes a base layer made of non-adhesive resin and an adhesive layer made of adhesive resin and layered on the base layer, the adhesive layer being adapted to be affixed to the reverse side 206 of the workpiece 201 and the annular frame 202.

The annular frame 202 is made of hard resin or metal and is of an annular shape with a circular opening 207 defined centrally therein. The inside diameter of the annular frame 202 is larger than the outside diameter of the workpiece 201. The annular frame 202 has an outer edge 208 on its outer circumference that includes a plurality of angularly spaced arcuate portions 208-1, a plurality of angularly spaced straight portions 208-2 contiguous to the arcuate portions 208-1, and a recess 209 defined as a recess in the outer edge 208 at a predetermined position thereon.

The workpiece 201 is fixedly supported in the opening 207 in the annular frame 202 by the sheet 200 that closes the opening 207 and that is affixed to the reverse side 206 of the workpiece 201. The sheet 200 affixed to the reverse side 206 of the workpiece 201 has an outer edge portion affixed to the annular frame 202 such that the orientation of the recess 209 with respect to the irregularly shaped portion 205 is directed in a predetermined desired orientation.

According to the present embodiment, there are available two types of annular frames 202 each having a different outside diameter, i.e., larger-diameter annular frames 202-1 and smaller-diameter annular frames 202-2. The larger-diameter annular frame 202-1 is larger in outside diameter than the smaller-diameter annular frame 202-2. Hereinafter, when these different annular frames are to be distinguished from each other, they will be referred to as larger-diameter annular frames 202-1 and smaller-diameter annular frames 202-2, and when they are not to be distinguished from each other, they will be referred to as annular frames 202.

The sheet affixing apparatus 1 according to the present embodiment operates to affix the sheet 200 to the annular frame 202 with the recess 209 defined in the outer edge 208 at the predetermined position thereon in closing relation to the opening 207, thereby securely positioning the workpiece 201 in the opening 207 with the sheet 200. The sheet affixing apparatus 1 according to the present embodiment also operates to affix the sheet 200 to the workpiece 201 and the annular frame 202 such that the orientation of the recess 209 with respect to the irregularly shaped portion 205 is directed in the desired orientation referred to above.

As illustrated in FIG. 1, the sheet affixing apparatus 1 includes the sheet affixing unit 2 that affixes the sheet 200 to the annular frame 202 and the workpiece 201, a frame stocker 10 for stocking annular frames 202 stacked therein, and a frame unloading unit 70 for unloading one at a time of annular frames 202 from the frame stocker 10 and loading one at a time of the annular frames 202 unloaded from the frame stocker 10 into the sheet affixing unit 2.

As illustrated in FIG. 1, the sheet affixing unit 2 includes a chuck table 3, a winding device 4, an affixing device 5, and a relatively moving device, not depicted.

The chuck table 3 holds a workpiece 201 and an annular frame 202 thereon. Specifically, the chuck table 3 holds a workpiece 201 and an annular frame 202 on an upper surface thereof when the workpiece 201 loaded by a workpiece delivery unit, not depicted, is placed thereon and also when the annular frame 202 loaded by the frame unloading unit 70 is placed thereon. The annular frame 202 is placed on the workpiece 201 on an upper surface of the chuck table 3 such that annular frame 202 is angularly directed in the desired orientation with respect to the workpiece 201.

According to the present embodiment, further, the chuck table 3 positions the reverse side 206 of the workpiece 201 and the upper surface of the annular frame 202 so as to lie flush with each other.

The winding device 4 pulls a peel-off sheet 211 with sheets 200 temporarily bonded thereto at spaced intervals from a sheet roll, not depicted. The sheet roll includes a coiled peel-off sheet 211 with sheets 200 temporarily bonded at spaced intervals thereto. The winding device 4 is rotatable about its central axis by an electric motor, not depicted. When the winding device 4 starts to operate, it holds the leading end of the peel-off sheet 211 on its outer circumferential surface and starts to wind the peel-off sheet 211 therearound as it is rotated in a direction to wind the peel-off sheet 211. Upon continued rotation, the winding device 4 continuously reels out the peel-off sheet 211 from the tape roll toward the affixing device 5.

The affixing device 5 affixes one of the sheets 200 peeled off from the peel-off sheet 211 reeled out from the sheet roll to the workpiece 201 and the annular frame 202 that are securely held on the chuck table 3. The affixing device 5 includes the presser plate 6 that is disposed laterally of the winding device 4 and that has a tapered tip end portion for folding back the sheet 200, the presser roller 7 disposed adjacent to the presser plate 6, and the relatively moving device, not depicted.

The presser plate 6 is inclined to a horizontal direction in such a manner as to have a tip end portion remote from the winding device 4 at a position lower than the rest of the presser plate 6. The tip end portion of the presser plate 6 is progressively thinner in a direction away from the winding device 4. The presser plate 6 has a width larger than the width of the sheet 200. The presser plate 6 feeds the adhesive layer of the sheet 200 folded back by the tip end portion thereof toward the annular frame 202 and the workpiece 201 that are securely held on the chuck table 3.

The presser roller 7 has its longitudinal axis extending parallel to the axis of the sheet roll and the axis of the winding device 4. The presser roller 7 presses the sheet 200 fed toward the annular frame 202 and the workpiece 201 by the presser plate 6 against the annular frame 202 and the workpiece 201 on the chuck table 3.

The relatively moving device moves the chuck table 3 and the affixing device 5 relatively to each other along the upper surface of the chuck table 3. According to the present embodiment, the relatively moving device moves the chuck table 3 in the direction indicated by the arrow in FIG. 1 along the upper surface thereof with respect to the affixing device 5.

The affixing device 5 affixes the sheet 200 reeled out by the winding device 4 to the workpiece 201 and the annular frame 202 by moving the sheet 200 folded back by the tip end portion of the presser plate 6 from the position where the end of the annular frame 202 remoter from the winding device 4 in the direction along the upper surface of the chuck table 3 away from the winding device 4.

As illustrated in FIGS. 1 and 3, the frame stocker 10 includes a base 11, a support stage 12, a lifting and lowering unit 20, a plurality of abutting members 30, an abutting member sliding mechanism 31 (see FIG. 1), an openable and closable door 40, a sensor 42 (see FIG. 3), an entry member 50, a link mechanism 53, and a control unit 100. The base 11 is in the form of a flat plate having upper and lower surfaces that are flat along horizontal directions.

The support stage 12 is disposed centrally over an upper surface of the base 11 and supports a plurality of annular frames 202 placed in a layered fashion thereon. The support stage 12 is in the form of a flat circular plate having upper and lower surfaces that are flat along horizontal directions. The support stage 12 has a plurality of recesses 13 defined in an outer edge thereof and shaped for the abutting members 30 to enter. According to the present embodiment, the annular frames 202 are placed on the support stage 12 such that some of the straight portions 208-2 face the abutting members 30.

The lifting and lowering unit 20 lifts and lowers the support stage 12 in directions perpendicular to the upper and lower surfaces of the base 11 and the support stage 12. The lifting and lowering unit 20 includes an electric motor, not depicted, a screw shaft rotatable about its central axis by the electric motor, and a lifting and lowering block 21 that can be lifted and lowered when the screw shaft rotates about its central axis and that is fixed to the support stage 12. The lifting and lowering unit 20 is fixed to the support stage 12 as it includes the lifting and lowering block 21 fixed to the support stage 12.

The abutting members 30 are erected around the support stage 12 and abut against the respective straight portions 208-2 of the outer edges 208 on side surfaces of the annular frames 202 placed on the support stage 12, to position the annular frames 202 in a predetermined position on the support stage 12. The abutting members 30 are shaped as columns erected from the base 11 and disposed around the support stage 12 on the base 11. According to the present embodiment, the abutting members 30 include an abutting member 30 disposed near the lifting and lowering block 21 of the lifting and lowering unit 20 on the base 11 and two abutting members 30 facing each other across the center of the support stage 12 such that the abutting member 30 near the lifting and lowering block 21 is positioned between the two abutting members 30 (denoted by 30-1) as viewed in front elevation, as illustrated in FIG. 1. Therefore, there are a total of three abutting members 30 according to the present embodiment. If the abutting members are not to be distinguished from each other, they are denoted by 30, and if the two abutting members are to be distinguished from the abutting member 30 near the lifting and lowering block 21, they are denoted by 30-1.

The abutting members 30 are movable radially with respect to the support stage 12 parallel to the upper and lower surfaces of the base 11 and the support stage 12 by the abutting member sliding mechanism 31. The abutting members 30 are simultaneously movable in one direction by the abutting member sliding mechanism 31. When the abutting members 30 are moved radially toward the center of the support stage 12, they abut against the straight portions 208-2 of the outer edges 208 of the annular frames 202 and press the straight portions 208-2 to position the annular frames 202 in a predetermined position on the support stage 12.

The abutting member sliding mechanism 31 moves all the abutting members 30 radially in one radial direction with respect to the support stage 12. As illustrated in FIG. 1, the abutting member sliding mechanism 31 includes an electric motor, not depicted, a circular plate 32 that is disposed centrally on the upper surface of the base 11 and below the support stage 12 and that is rotatable about its central axis by the electric motor, a plurality of rails 33 that are fixedly mounted on the support stage 12 respectively in association with the abutting members 30 and that extend parallel to radial directions of the support stage 12, a plurality of slide blocks 34 movably supported by the respective rails 33 respectively in association with the abutting members 30 and fixed to the abutting members 30, respectively, and a plurality of links 35 having opposite ends coupled to the respective slide blocks 34 and the circular plate 32. When the electric motor is energized, it rotates the circular plate 32 about its central axis, causing the links 35 to move the slide blocks 34, i.e., the abutting members 30, simultaneously radially inwardly or outwardly with respect to the support stage 12.

The frame stocker 10 also includes a support plate 14 (see FIG. 3) erected from the base 11 in the vicinity of one of the two abutting members 30-1.

The openable and closable door 40 is disposed laterally of the support stage 12 and separates an area that houses the support stage 12 and the abutting members 30 therein from the exterior of the frame stocker 10. Specifically, the area that houses the support stage 12 and the abutting members 30 therein extends over the upper surface of the support stage 12 and is surrounded by the abutting members 30. The openable and closable door 40 has both surfaces extending flatwise vertically. As illustrated in FIGS. 3 and 4, the openable and closable door 40 is angularly movably supported on the support plate 14 by a hinge, not depicted, that is attached to an end of the openable and closable door 40 in a widthwise direction thereof.

The openable and closable door 40 is angularly movable about the hinge, i.e., the end thereof in the widthwise direction thereof, between a position indicated by the two-dot-and-dash lines in FIG. 3 where the openable and closable door 40 extends along an outer edge of the base 11 and closes a space between the two abutting members 30-1 and a position indicated by the solid lines in FIG. 3 where the openable and closable door 40 extends in a direction across the outer edge of the base 11 and opens the space between the two abutting members 30-1. The angular movement of the openable and closable door 40 about the hinge, i.e., the end thereof in the widthwise direction thereof, will be referred to as opening and closing movement of the openable and closable door 40 hereinbelow.

When the openable and closable door 40 closes the space between the two abutting members 30-1, it prevents annular frames 202 from being introduced from outside and placed on the support stage 12 and also prevents annular frames 202 from being taken from the support stage 12 and out of the frame stocker 10. On the other hand, when the openable and closable door 40 opens the space between the two abutting members 30-1, it allows annular frames 202 to be introduced from outside and placed on the support stage 12 and also allows annular frames 202 to be taken from the support stage 12 and out of the frame stocker 10.

The abutting members 30 for positioning annular frames 202 on the support stage 12 and the openable and closable door 40 are disposed laterally of the support stage 12 that supports annular frames 202 placed on its upper surface. Therefore, the frame stocker 10 makes it possible to place annular frames 202 laterally onto the support stage 12 and also to take annular frames 202 laterally from the support stage 12. According to the present embodiment, the openable and closable door 40 has a handle 41 that can be gripped by an operator.

The sensor 42 detects when the openable and closable door 40 is closed and outputs a detection signal to the control unit 100. According to the present embodiment, the sensor 42 is, for example, a proximity sensor that detects when the openable and closable door 40 has closed the space between the two abutting members 30-1.

The entry member 50 is movable into and out of the recesses 209 of annular frames 202 placed on the support stage 12 in ganged relation to the opening and closing movement of the openable and closable door 40.

As illustrated in FIG. 3, the entry member 50 is in the form of a cylindrical post erected from a slide base 51 disposed on the base 11 in a position around the support stage 12 and movable radially with respect to the support stage 12. The entry member 50 has a longitudinal axis extending perpendicularly to the upper and lower surfaces of the support stage 12, i.e., parallel to the direction along which annular frames 202 are stacked on the support stage 12. The slide base 51 is slidably supported on a slide base support table 52 (see FIG. 4) for sliding movement in radial directions of the support stage 12.

When annular frames 202 are placed on the support stage 12 in an orientation that is desirable when a sheet 200 is to be affixed to an annular frame 202 by the sheet affixing unit 2, the entry member 50 faces the recesses 209 of the annular frames 202.

The link mechanism 53 interlinks the opening and closing movement of the openable and closable door 40 and the movement of the entry member 50 into and out of the recess 209 of the annular frame 202 placed on the support stage 12. Specifically, when the openable and closable door 40 opens the space between the two abutting members 30-1, the link mechanism 53 moves the slide base 51 radially outwardly with respect to the support stage 12 to retract the entry member 50 out of the recesses 209 of the annular frames 202 placed on the support stage 12. On the other hand, when the openable and closable door 40 closes the space between the two abutting members 30-1, the link mechanism 53 moves the slide base 51 radially inwardly with respect to the support stage 12 to introduce the entry member 50 into the recesses 209 of the annular frames 202 placed on the support stage 12.

According to the present embodiment, as illustrated in FIG. 4, the link mechanism 53 includes a first helical tension spring 54 and a second helical tension spring 55. The first helical tension spring 54 has opposite ends attached respectively to the slide base 51 and the openable and closable door 40, and normally urges the slide base 51 and the openable and closable door 40 to move toward each other. The second helical tension spring 55 has opposite ends attached respectively to a pole 15 erected from the base 11 and positioned more radially inwardly of the support stage 12 than the slide base 51 and the slide base 51, and normally urges the erected pole 15 and the slide base 51 toward each other.

When the openable and closable door 40 is opened, the first helical tension spring 54 pulls the slide base 51 radially outwardly with respect to the support stage 12 to retract the entry member 50 out of the recesses 209 of the annular frames 202 placed on the support stage 12. On the other hand, when the openable and closable door 40 is closed, the second helical tension spring 55 pulls the slide base 51 radially inwardly with respect to the support stage 12 to introduce the entry member 50 into the recesses 209 of the annular frames 202 placed on the support stage 12.

Therefore, when the openable and closable door 40 is closed, the link mechanism 53 moves the entry member 50 into the recesses 209 of the annular frames 202 that are placed in the predetermined orientation on the support stage 12. If at least one of the annular frames 202 on the support stage 12 is directed in an orientation different from the predetermined orientation, then, when the openable and closable door 40 is closed, the entry member 50 hits one of the arcuate portions 208-1 of the outer edge 208 of the at least one annular frame 202 and does not enter the recess 209 thereof.

As illustrated in FIG. 3, the link mechanism 53 includes a closure controller 56. When the entry member 50 enters the recesses 209 of all the annular frames 202 on the support stage 12, the closure controller 56 allows the openable and closable door 40 to be closed. When the entry member 50 does not enter the recesses 209 of all the annular frames 202 on the support stage 12, the closure controller 56 prevents the openable and closable door 40 from being closed. According to the present embodiment, the closure controller 56 extends from the slide base 51 toward the openable and closable door 40. When the entry member 50 does not enter the recesses 209 of the annular frames 202 placed on the support stage 12, the closure controller 56 physically interferes with the openable and closable door 40, preventing the openable and closable door 40 from being closed. Conversely, when the entry member 50 enters the recesses 209 of the annular frames 202 placed on the support stage 12, the closure controller 56 is brought out of physical interference with the openable and closable door 40, allowing the openable and closable door 40 to be closed.

The entry member 50 is coupled to the closure controller 56 by the slide base 51. When the entry member 50 enters the recesses 209 of all the annular frames 202 placed in the predetermined orientation on the support stage 12, the entry member 50 closes the openable and closable door 40 through the link mechanism 53 with the closure controller 56 positioned out of physical interference with the openable and closable door 40. When the entry member 50 does not enter the recess 209 of at least one of the annular frames 202 that is placed on the support stage 12 in an orientation different from the predetermined orientation, the entry member 50 keeps the openable and closable door 40 open with the closure controller 56 positioned in physical interference with the openable and closable door 40.

As illustrated in FIGS. 1 and 3, the frame stocker 10 according to the present embodiment includes a height detection sensor 60 for detecting when the uppermost one of the stacked annular frames 202 placed on the support stage 12 is positioned at a predetermined height. According to the present embodiment, the predetermined height refers to the height of a horizontal plane lying at the upper ends of the abutting members 30. At the time at which the height detection sensor 60 detects when the uppermost one of the stacked annular frames 202 on the support stage 12 is positioned at the predetermined height, the height detection sensor 60 outputs a detection signal to the control unit 100.

The control unit 100 controls the components described above of the frame stocker 10. According to the present embodiment, moreover, the control unit 100 controls the components described above of the sheet affixing apparatus 1 to enable the sheet affixing apparatus 1 to affix sheets 200 to workpieces 201 and annular frames 202. The control unit 100 includes a computer including an arithmetic processing device having a microprocessor such as a central processing unit (CPU), a storage device having a memory such as a read only memory (ROM) and a random access memory (RAM), and an input/output interface device. The computer can read computer programs stored in the storage device and execute the read computer programs.

The arithmetic processing device of the control unit 100 runs the computer programs stored in the ROM on the RAM and generates control signals for controlling the frame stocker 10 and the sheet affixing apparatus 1. The arithmetic processing device of the control unit 100 outputs the generated control signals through the input/output interface device to the components of the frame stocker 10 and the sheet affixing apparatus 1.

To the control unit 100, there are electrically connected a display unit including a liquid crystal display device or the like for displaying various states and images in a sheet affixing process and an input unit for entering processing content information to be registered by the operator. The input unit includes at least one of a touch panel incorporated in the display unit and an input device such as a keyboard.

Figure 5:
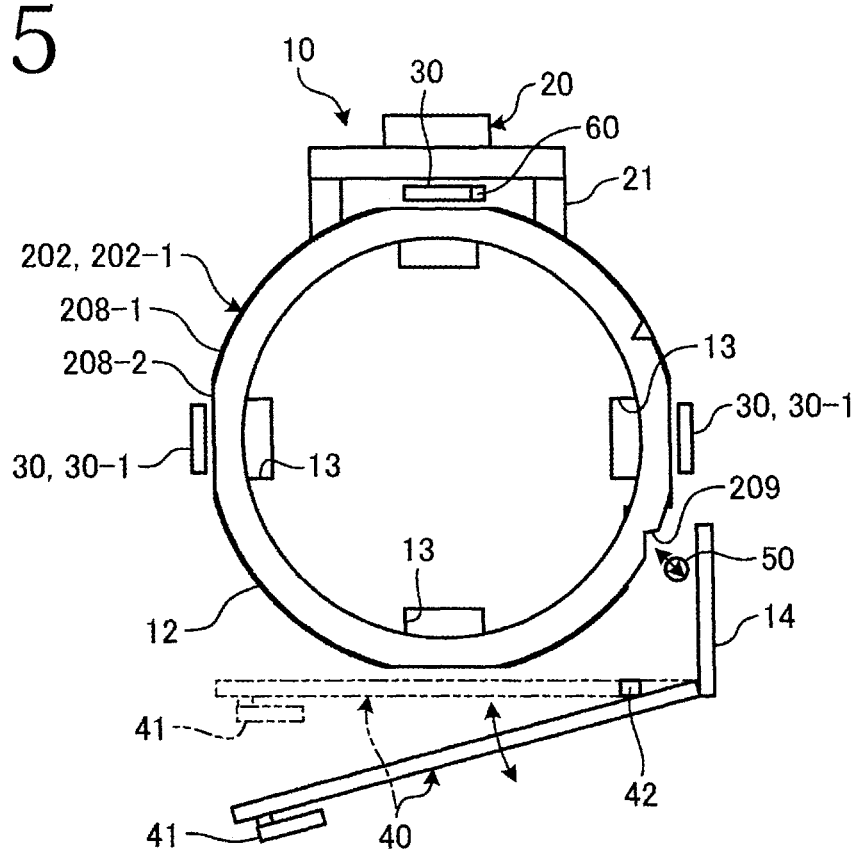
FIG. 5 is a schematic plan view illustrating an example of the manner in which an annular frame is stocked in the frame stocker of the sheet affixing apparatus illustrated in FIG. 1 and an openable and closable door is closed.
Figure 6:
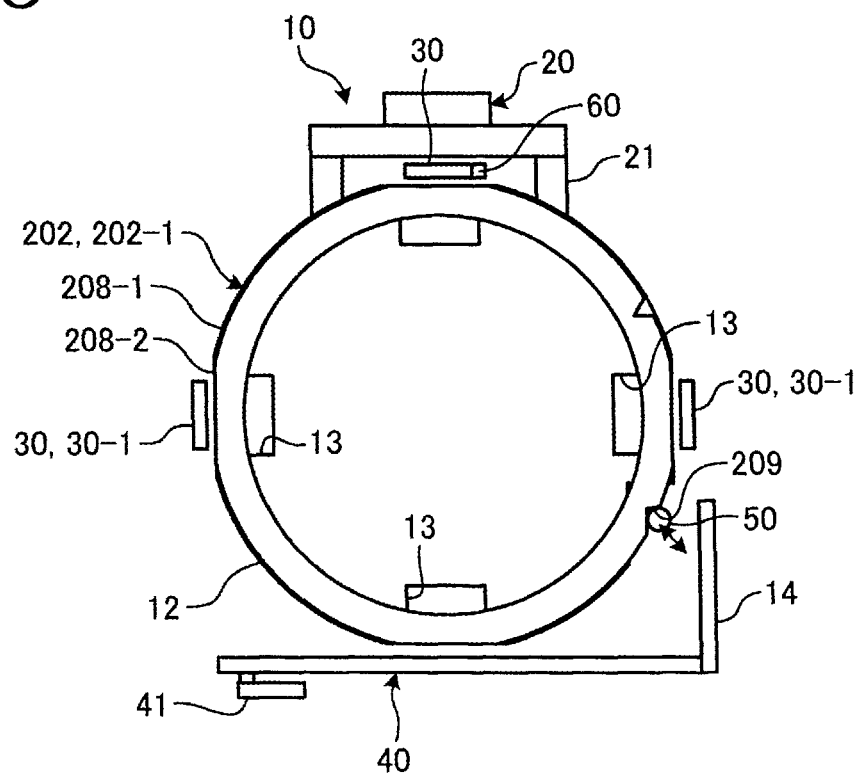
FIG. 6 is a schematic plan view illustrating an example of the manner in which the openable and closable door illustrated in FIG. 5 has been closed.
Figure 7:
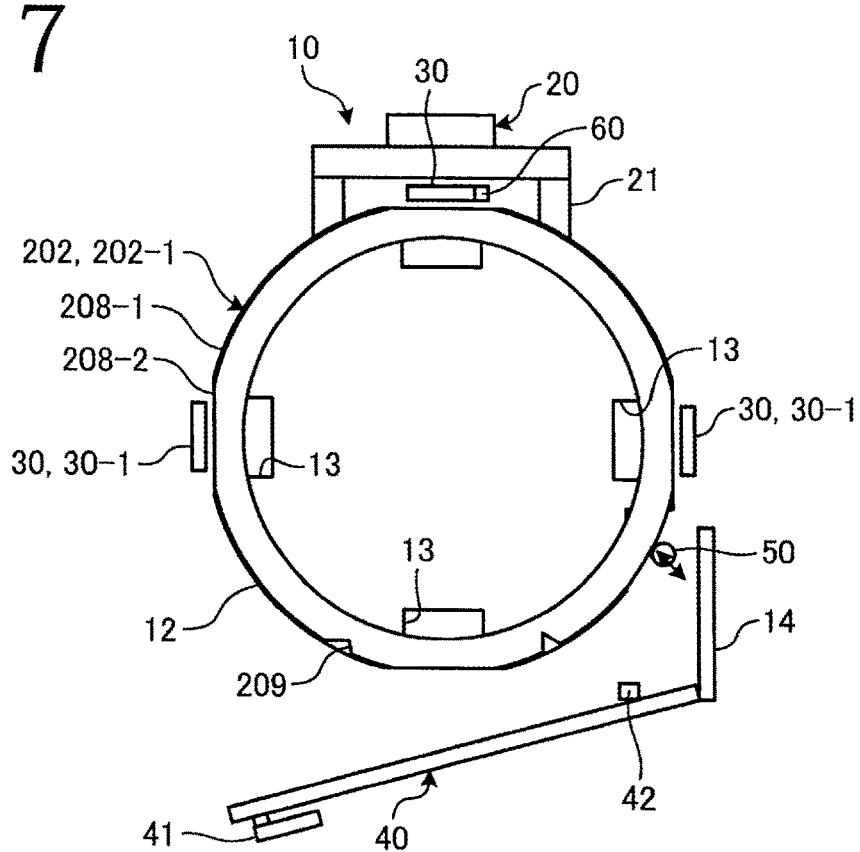
FIG. 7 is a schematic plan view illustrating another example of the manner in which an annular frame is stocked in the frame stocker of the sheet affixing apparatus illustrated in FIG. 1 and the openable and closable door is closed.
Figure 8:
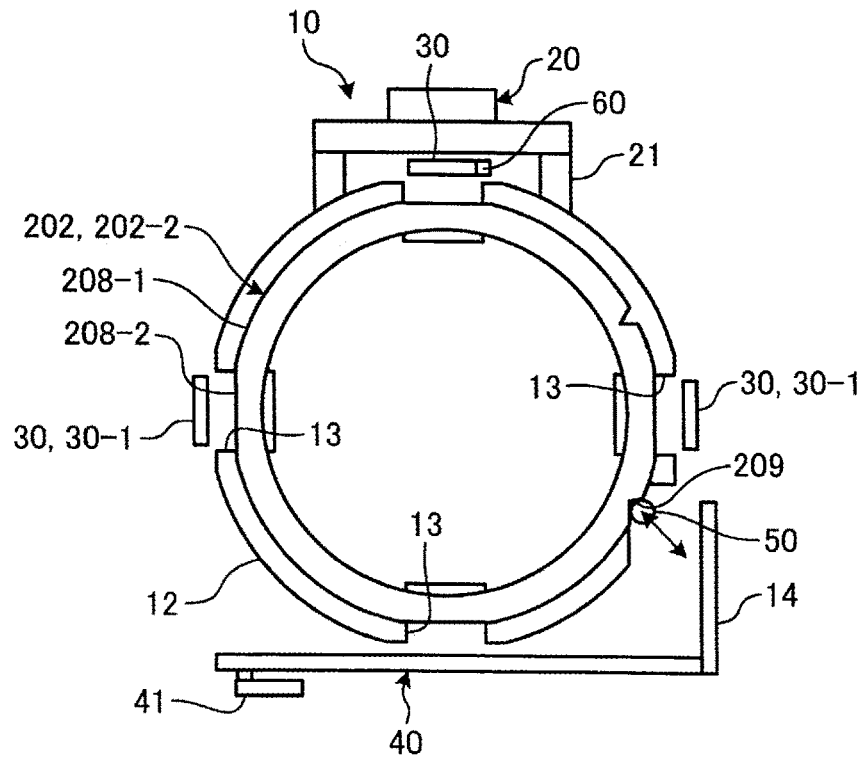
FIG. 8 is a schematic plan view illustrating another example of the manner in which the openable and closable door illustrated in FIG. 5 has been closed.
Figure 9:
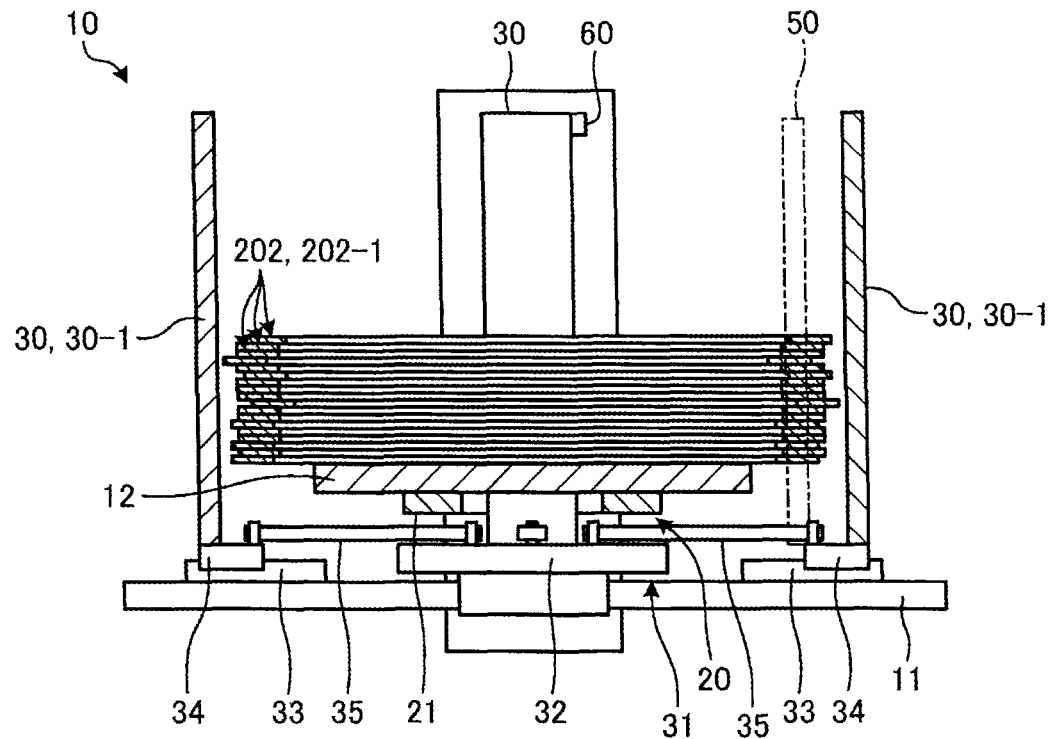
FIG. 9 is a schematic side elevational view, partly in cross section, of the frame stocker illustrated in FIG. 6.
Figure 10:
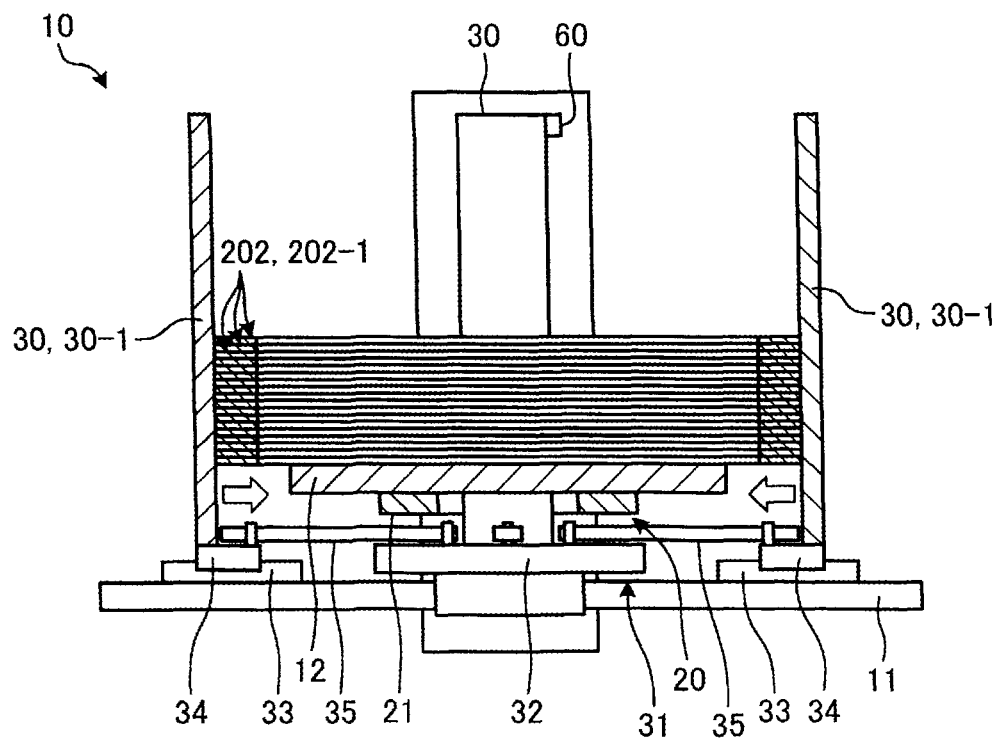
FIG. 10 is a schematic side elevational view, partly in cross section, illustrating the manner in which abutting members of the frame stocker illustrated in FIG. 9 have positioned annular frames.
Figure 11:
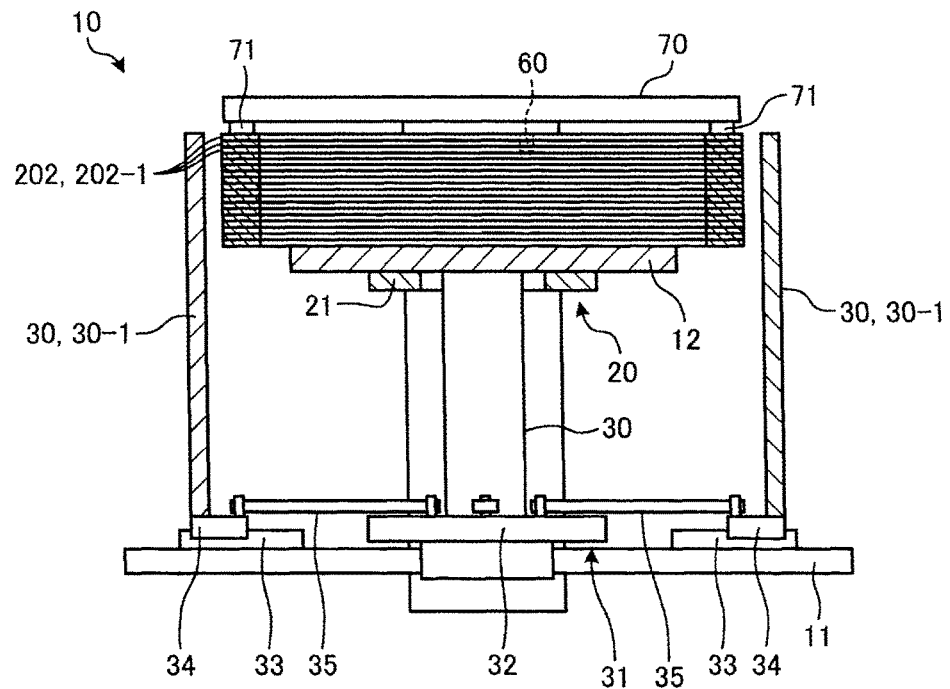
FIG. 11 is a schematic side elevational view, partly in cross section, illustrating the manner in which a lifting and lowering unit of the frame stocker illustrated in FIG. 10 has lifted the annular frames.
Figure 12:
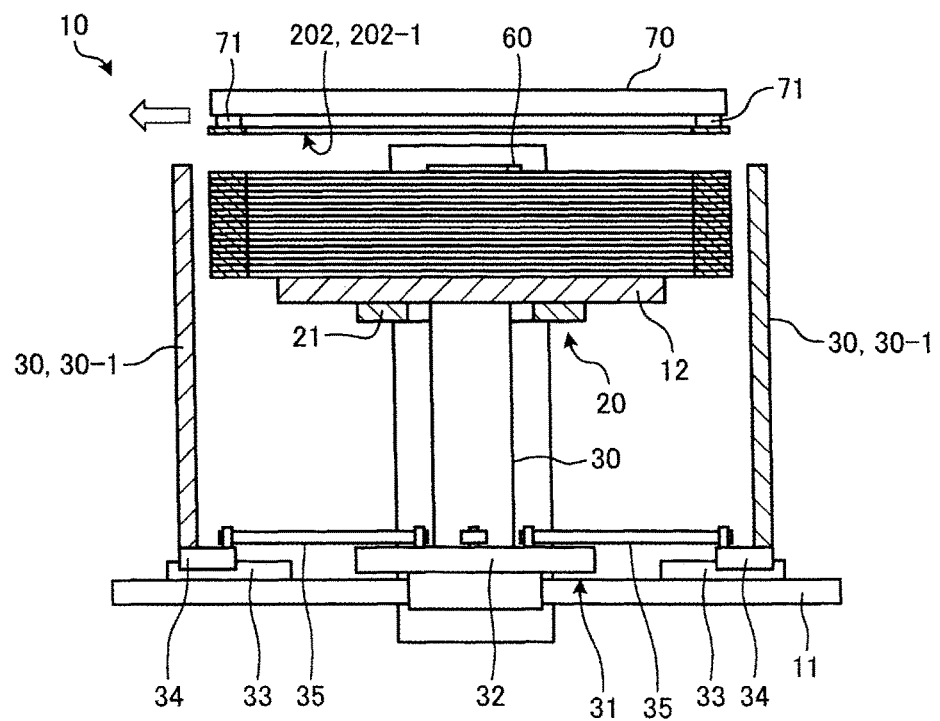
FIG. 12 is a schematic side elevational view, partly in cross section, illustrating the manner in which a frame unloading unit is unloading an uppermost one of the annular frames that are placed on a support stage of the frame stocker illustrated in FIG. 11.

An example of a process for affixing a sheet 200 to a workpiece 201 and an annular frame 202 on the sheet affixing apparatus 1 will be described below by way of example. FIG. 5 schematically illustrates in plan an example of the manner in which an annular frame is stocked in the frame stocker of the sheet affixing apparatus illustrated in FIG. 1 and the openable and closable door is closed. FIG. 6 schematically illustrates in plan an example of the manner in which the openable and closable door illustrated in FIG. 5 has been closed. FIG. 7 schematically illustrates in plan another example of the manner in which an annular frame is stocked in the frame stocker of the sheet affixing apparatus illustrated in FIG. 1 and the openable and closable door is closed. FIG. 8 schematically illustrates in plan another example of the manner in which the openable and closable door illustrated in FIG. 5 has been closed. FIG. 9 schematically illustrates in side elevation, partly in cross section, the frame stocker illustrated in FIG. 6. FIG. 10 schematically illustrates in side elevation, partly in cross section, the manner in which the abutting members of the frame stocker illustrated in FIG. 9 have positioned annular frames. FIG. 11 schematically illustrates in side elevation, partly in cross section, the manner in which the lifting and lowering unit of the frame stocker illustrated in FIG. 10 has lifted the annular frames. FIG. 12 schematically illustrates in side elevation, partly in cross section, the manner in which the frame unloading unit is unloading an uppermost one of the annular frames that are placed on the support stage of the frame stocker illustrated in FIG. 11.

The openable and closable door 40 of the frame stocker 10 is opened as indicated by the solid lines in FIG. 5, and at least one annular frame 202 is introduced laterally into the frame stocker 10 between the two abutting members 30-1 until one of the straight portions 208-2 of the outer edge 208 of the annular frame 202 abuts against the abutting member 30 near the lifting and lowering unit 20, and placed on the support stage 12, as illustrated in FIG. 5. When a predetermined number of annular frames 202 are stacked on the support stage 12 and housed in the frame stocker 10, the operator turns the openable and closable door 40 in a direction to close the space between the two abutting members 30-1, as indicated by the two-dot-and-dash lines in FIG. 5.

At this time, providing all the introduced annular frames 202 are placed in the predetermined orientation on the support stage 12, the entry member 50 enters the recesses 209 of all the annular frames 202, allowing the openable and closable door 40 to close the space between the two abutting members 30-1, as illustrated in FIG. 6. If at least one of the annular frames 202 on the support stage 12 is directed in an orientation that is different from the predetermined orientation, then the entry member 50 does not enter the recesses 209 of all the annular frames 202, and the closure controller 56 prevents the openable and closable door 40 from being closed, as illustrated in FIG. 7.

When the openable and closable door 40 is not closed, as illustrated in FIG. 7, the operator confirms and corrects the orientations of the annular frames 202 in the frame stocker 10, so that all the annular frames 202 are placed in the predetermined orientation on the support stage 12. In FIGS. 5, 6, and 7, a plurality of larger-diameter annular frames 202-1 are illustrated as being placed on the support stage 12.

When a plurality of smaller-diameter annular frames 202-2 are placed on the support stage 12 in the frame stocker 10 in the predetermined direction, the entry member 50 enters the recesses 209 of all the smaller-diameter annular frames 202-2, allowing the openable and closable door 40 to close the space between the two abutting members 30-1, as illustrated in FIG. 8.

As described above, when the entry member 50 enters the recesses 209 of the annular frames 202 on the support stage 12 in the frame stocker 10, as illustrated in FIG. 9, the openable and closable door 40 is closed. The sensor 42 detects when the openable and closable door 40 is closed, i.e., detects that all the annular frames 202 on the support stage 12 are directed in the predetermined orientation, and outputs a detection signal to the control unit 100.

When the control unit 100 receives, from the sensor 42, the detection signal indicating that the openable and closable door 40 is closed, the control unit 100 controls the abutting member sliding mechanism 31 to move all the abutting members 30 radially inwardly toward the support stage 12. As illustrated in FIG. 10, the abutting members 30 abut against some of the straight portions 208-2 of the outer edge 208 of the annular frames 202 and press them radially inwardly, thereby positioning the annular frames 202 in a predetermined position on the support stage 12.

Then, the control unit 100 controls the abutting member sliding mechanism 31 to move all the abutting members 30 radially outwardly away from the support stage 12. Thereafter, the control unit 100 controls the lifting and lowering unit 20 to lift the support stage 12 and hence the annular frames 202 on the support stage 12. When the detection sensor 60 detects that the uppermost annular frame 202 is positioned at the predetermined height, the detection sensor 60 outputs, to the control unit 100, a detection signal indicating that the uppermost annular frame 202 is positioned at the predetermined height.

In response to the detection signal from the detection sensor 60, the control unit 100 controls the lifting and lowering unit 20 to stop lifting the support stage 12. The control unit 100 then controls a moving mechanism, not depicted, to move the frame unloading unit 70 to a position above the frame stocker 10, and then to lower the frame unloading unit 70 toward the frame stocker 10 until suction holders 71 of the frame unloading unit 70 contact the uppermost annular frame 202 of the stack on the support stage 12, as illustrated in FIG. 11.

After the suction holders 71 of the frame unloading unit 70 has held the uppermost annular frame 202 under suction, the control unit 100 controls the moving mechanism to lift the frame unloading unit 70 to elevate the annular frame 202 held under suction on the suction holders 71 to a position above the abutting members 30. Then, the control unit 100 controls the moving mechanism to move the frame unloading unit 70 that is holding the annular frame 202 to the sheet affixing unit 2 where the annular frame 202 is placed onto the upper surface of the chuck table 3 (see FIG. 1).

Thereafter, the sheet affixing unit 2 affixes a sheet 200 peeled off from the peel-off sheet 211 to the workpiece 201 and the annular frame 202. In FIGS. 9, 10, and 12, a plurality of larger-diameter annular frames 202-1 are illustrated as being placed on the support stage 12. After the openable and closable door 40 has been closed, the entry member 50 stays in the recesses 209 of the annular frame 202 placed on the support stage 12. As described above, the support stage 12 positions the uppermost one of the stacked annular frames 202 on the support stage 12 at the predetermined height, and the uppermost annular frame 202 is unloaded from the frame stocker 10 while the entry member 50 is remaining in the recesses 209 of the annular frame 202 on the support stage 12.

When the sensor 42 detects that the openable and closable door 400 is closed, the control unit 100 controls the components as illustrated in FIGS. 9 to 12. Specifically, when the sensor 42 detects that the openable and closable door 400 is closed, the control unit 100 determines that the annular frames 202 are placed in the predetermined orientation on the support stage 12, and controls the frame unloading unit 70 to unload the annular frames 202 one by one from the frame stocker 10.

The sheet affixing apparatus 1 according to the present embodiment as described above includes the frame stocker 10 that includes the entry member 50 for entering the recesses 209 of the annular frames 202 placed on the support stage 12, the closure controller 56 for preventing the openable and closable door 40 from being closed unless the entry member 50 enters the recess 209 of at least one of the annular frames 202, and the sensor 42 for detecting when the openable and closable door 40 is closed. The sheet affixing apparatus 1 is thus able to determine that at least one of the annular frames 202 on the support stage 12 is not directed in the predetermined orientation if the openable and closable door 40 is not closed. Consequently, the sheet affixing apparatus 1 does not affix a sheet 200 to an annular frame 202 and a workpiece 201 combined therewith if the annular frame 202 is not properly oriented. Stated otherwise, the sheet affixing apparatus 1 is able to affix a sheet 200 to an annular frame 202 and a workpiece 201 combined therewith providing the annular frame 202 is properly oriented, i.e., is directed in the predetermined orientation.

The frame stocker 10 also includes the abutting members 30 for abutting against some of the straight portions 208-2 of the outer edge 208 of the annular frames 202 on the support stage 12, instead of the conventional pins for positioning annular frames. Accordingly, the operator can place annular frames 202 laterally onto the support stage 12 in the frame stocker 10 without laborious work to lift and lower the annular frames 202.

Further, the sheet affixing apparatus 1 according to the present embodiment is also advantageous in that since the sensor 42 that is normally combined with the openable and closable door 40 detects when the openable and closable door 40 is closed and the control unit 100 determines that the annular frames 202 are placed in the predetermined orientation on the support stage 12, on the basis of the detection signal from the sensor 42, it is not necessary to add another sensor for detecting the orientations of the annular frames 202.

The present invention is not limited to the illustrated embodiment described above. Various changes and modifications may be made therein without departing from the scope of the invention. For example, the sheet 200 may be a sheet devoid of an adhesive layer and including only a base layer of thermoplastic resin.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A sheet affixing apparatus for affixing a sheet to an annular frame having a recess defined therein at a predetermined position on an outer circumferential edge thereof in closing relation to an opening defined in the annular frame, with a workpiece being securely placed in the opening by the sheet, the sheet affixing apparatus comprising:
   a frame stocker for housing a plurality of annular frames stacked therein;
   a frame unloading unit for unloading one at a time of the annular frames from the frame stocker; and
   a sheet affixing unit for affixing the sheet to the annular frame and the workpiece;
   wherein the frame stocker includes
      a support stage for supporting the stack of annular frames placed thereon,
      a plurality of abutting members for abutting against side surfaces of the annular frames to position the annular frames in a predetermined position on the support stage, the abutting members being erected around the support stage,
      an openable and closable door for separating an area that houses the support stage and the abutting members therein, the openable and closable door being disposed laterally of the support stage,
      a sensor for detecting when the openable and closable door is closed,
      an entry member movable into and out of recesses of the annular frames placed on the support stage, in ganged relation to opening and closing movement of the openable and closable door, and
      a control unit,
   the entry member is installed to allow the openable and closable door to be closed when the entry member enters the recesses of the annular frames that are placed on the support stage in a predetermined orientation, and,
   when the sensor detects when the openable and closable door is closed, the control unit determines that the annular frames are placed on the support stage in the predetermined orientation, and allows the frame unloading unit to unload one at a time of the annular frames from the frame stocker.

2. The sheet affixing apparatus according to claim 1, wherein the frame stocker further includes a lifting and lowering unit, the support stage being fixedly mounted on the lifting and lowering unit, and
the lifting and lowering unit lifts the support stage such that an uppermost one of the annular frames stacked on the support stage is positioned at a predetermined height, and the frame unloading unit unloads the uppermost one of the annular frames from the frame stocker while the entry member is staying in the recesses of the annular frames stacked on the support stage.

* * * * *